United States Patent
Takahashi et al.

(10) Patent No.: US 6,445,633 B2
(45) Date of Patent: Sep. 3, 2002

(54) READ AMPLIFIER CIRCUIT FOR HIGH-SPEED READING AND SEMICONDUCTOR MEMORY DEVICE EMPLOYING THE READ AMPLIFIER CIRCUIT

(75) Inventors: Mitsue Takahashi, Hyogo (JP); Hiroaki Tanizaki, Hyogo (JP)

(73) Assignees: Mitsubishi Kabushiki Kaisha, Tokyo (JP); Mitsubishi Electric Engineering Company Limited, Tokyo (JP)

( * ) Notice: Subject to any disclaimer, the term of this patent is extended or adjusted under 35 U.S.C. 154(b) by 0 days.

(21) Appl. No.: 09/791,772

(22) Filed: Feb. 26, 2001

(30) Foreign Application Priority Data

May 25, 2000 (JP) ........................................ 2000-154078

(51) Int. Cl.$^7$ ................................................. G11C 7/00
(52) U.S. Cl. .................. 365/205; 365/189.01; 365/196; 365/202; 365/204; 365/207
(58) Field of Search ............................ 365/189.01, 205, 365/207, 202, 204, 196

(56) References Cited

U.S. PATENT DOCUMENTS

| | | | | |
|---|---|---|---|---|
| 5,587,952 A | * | 12/1996 | Kitsukawa et al. | 365/207 |
| 5,708,622 A | * | 1/1998 | Ohtani et al. | 365/233 |
| 5,844,849 A | * | 12/1998 | Furutani | 365/194 |
| 5,953,261 A | * | 9/1999 | Furutani et al. | 365/189.05 |
| 6,088,278 A | * | 7/2000 | Porter et al. | 365/208 |
| 6,246,614 B1 | * | 6/2001 | Ovishi | 365/191 |
| 6,314,028 B1 | * | 11/2001 | Kono | 365/189.09 |
| 6,317,368 B1 | * | 11/2001 | Taito et al. | 365/189.11 |
| 6,333,889 B1 | * | 12/2001 | Arimoto | 365/230.03 |

FOREIGN PATENT DOCUMENTS

JP 9-139088 5/1997

OTHER PUBLICATIONS

"Ultra LSI Memory", K. Ito, Advanced Electronics Series, Nov. 5, 1994, pp. 170–173.

* cited by examiner

Primary Examiner—Viet Q. Nguyen
(74) Attorney, Agent, or Firm—McDermott, Will & Emery

(57) ABSTRACT

A read amplifier circuit includes an equalize start circuit. Based on a preamp enable signal PAE and an equalize signal IOEQ, the equalize start circuit generates an equalize start signal EQ for starting equalization at the timing when the preamp enable signal PAE is activated. Simultaneously with activation of a preamplifier by the preamp enable signal PAE, a pair of read lines GIOR and /GIOR is cut off from the preamplifier, and a P channel MOS transistor starts equalization of the pair of read lines GIOR and /GIOR. In this way, it is possible to start equalization of the paired read lines at the same time that the output signal is supplied to the preamplifier.

4 Claims, 8 Drawing Sheets

READ AMPLIFIER CIRCUIT FOR HIGH-SPEED READING AND SEMICONDUCTOR MEMORY DEVICE EMPLOYING THE READ AMPLIFIER CIRCUIT

BACKGROUND OF THE INVENTION

1. Field of the Invention

The present invention relates to a read amplifier circuit reading data from a memory array by amplifying it, and to a semiconductor memory device employing this read amplifier circuit.

2. Description of the Background Art

A read amplifier circuit as shown in FIG. 8 has been known that reads data from a memory array by transmitting an output signal amplified by a sense amplifier to a pair of read lines GIOR and /GIOR.

Read amplifier circuit 120 includes a pair of read lines GIOR and /GIOR, P channel MOS transistors 121-125, an N channel MOS transistor 126 and a preamplifier 130. Column selection transistors 111 and 112 each formed of an N channel MOS transistor are turned on when column selection signal CSLR is set at H (logical high) level. P channel MOS transistors 121-123 are turned on when equalize signal IOEQ is set at L (logical low) level to equalize the pair of read lines GIOR and /GIOR. P channel MOS transistors 124 and 125 are turned off when preamp enable signal PAE is activated to H (logical high) level and accordingly the pair of read lines GIOR and /GIOR is cut off from preamplifier 130. N channel MOS transistor 126 is turned on when preamp enable signal PAE is activated to H (logical high) level to activate preamplifier 130 accordingly.

An output signal read from each memory cell of a memory array (not shown) is present as a potential difference on a pair of bit lines BL and /BL. The output signal amplified by a sense amplifier 110 is output to the pair of read lines GIOR and /GIOR when column selection transistors 111 and 112 are turned on by column selection signal CSLR. During the period in which column selection transistors 111 and 112 are turned on by the column selection signal and a period added as a margin, equalize signal IOEQ stays at H level and thus the pair of read lines GIOR and /GIOR is not equalized. Therefore, as column selection transistors 111 and 112 start turning on, there is generated a potential difference on the paired read lines GIOR and /GIOR according to the output signal from the paired bit lines BL and /BL. When the potential difference reaches a potential difference (usually approximately 200 mV) which can be amplified by preamplifier 130, the output signal is supplied to preamplifier 130. Following this, when preamp enable signal PAE is set at H level, preamplifier 130 is cut off from the pair of read lines GIOR and /GIOR and N channel MOS transistor 126 is turned on to be activated. Preamplifier 130 then amplifies the output signal. Equalize signal IOEQ thereafter switches from H level to L level and the pair of read lines GIOR and /GIOR is equalized.

In such a conventional circuit, the pair of bit lines BL and /BL is connected to the pair of read lines GIOR and /GIOR via column selection transistors 111 and 112. For this reason, equalization of the paired read lines GIOR and /GIOR influences the paired bit lines BL and /BL that could cause equalization of the pair of bit lines BL and /BL. If such a state occurs, data cannot be read accurately.

Further, since a plurality of pairs of read lines GIOR and /GIOR are provided, a time difference arises between transmission of column selection signal CSLR to a pair of read lines GIOR and /GIOR located close to a column decoder which outputs column selection signal CSLR and transmission thereof to a pair of read lines GIOR and /GIOR located far from the column decoder. Then, the time period from turn-on of column selection transistors 111 and 112 to generation of a potential difference on a pair of read lines GIOR and /GIOR that can be amplified by preamplifier 130 is not constant. Therefore, equalization of paired read lines GIOR and /GIOR is started after amplification of an output signal by preamplifier 130 is completed. A resultant problem is that, on a pair of read lines GIOR and /GIOR where a potential difference is generated quickly, that potential difference is large at the start of equalization and accordingly a speedily equalization is impossible.

SUMMARY OF THE INVENTION

One object of the present invention is therefore to provide a read amplifier circuit reading data at a high speed.

A read amplifier circuit according to the present invention includes a pair of read lines receiving from a pair of bit lines an output signal amplified by a sense amplifier, a preamplifier connected to the pair of read lines to amplify the output signal in response to a preamp enable signal, a cut-off circuit cutting off the pair of read lines from the preamplifier when the preamp enable signal is activated, and an equalize circuit starting equalization of the pair of read lines when the preamp enable signal is activated.

Equalization of the read line pair is started at the same time that the preamplifier starts amplifying the output signal supplied to the pair of read lines. Equalization can thus be carried out speedily and consequently high-speed reading of data is possible.

Preferably, the read amplifier circuit further includes an equalize start circuit generating an equalize start signal based on an equalize signal and the preamp enable signal, for starting equalization of the read line pair when the preamp enable signal is activated, the equalize start circuit supplying the generated equalize start signal to the equalize circuit and supplying the preamp enable signal to the cut-off circuit.

The equalize start circuit outputs the preamp enable signal and the equalize start signal to simultaneously start activation of the preamplifier and equalization of the read line pair. In this way, high-speed equalization is possible which enables high-speed reading of data. Data can also be read speedily with a small number of additional circuits.

Preferably, the read amplifier circuit further includes a pre-equalize circuit starting pre-equalization of the read line pair when the preamp enable signal is activated, and the equalize circuit equalizes the read line pair after pre-equalization of the read line pair is started by the pre-equalize circuit.

The pre-equalize circuit starts pre-equalization of the read line pair simultaneously with activation of the preamp enable signal. Accordingly, equalization can be carried out quickly and data can be read at a high speed. The data can also be read speedily with a small number of additional circuits.

A semiconductor memory device according to the present invention includes a memory array storing data, and a read amplifier circuit receiving from the memory array an output signal according to the data to amplify and output the output signal to the outside. The read amplifier circuit includes a pair of read lines receiving from a pair of bit lines an output signal amplified by a sense amplifier, a preamplifier connected to the pair of read lines to amplify the output signal in response to a preamp enable signal, a cut-off circuit cutting off the pair of read lines from the preamplifier when the preamp enable signal is activated, and an equalize circuit starting equalization of the pair of read lines when the preamp enable signal is activated.

The output signal read from the memory array is amplified by the sense amplifier and thereafter input to the pair of read lines. At the same time that the preamplifier starts amplification of the output signal, equalization of the read line pair is started and accordingly data reading cycle can be carried out faster.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
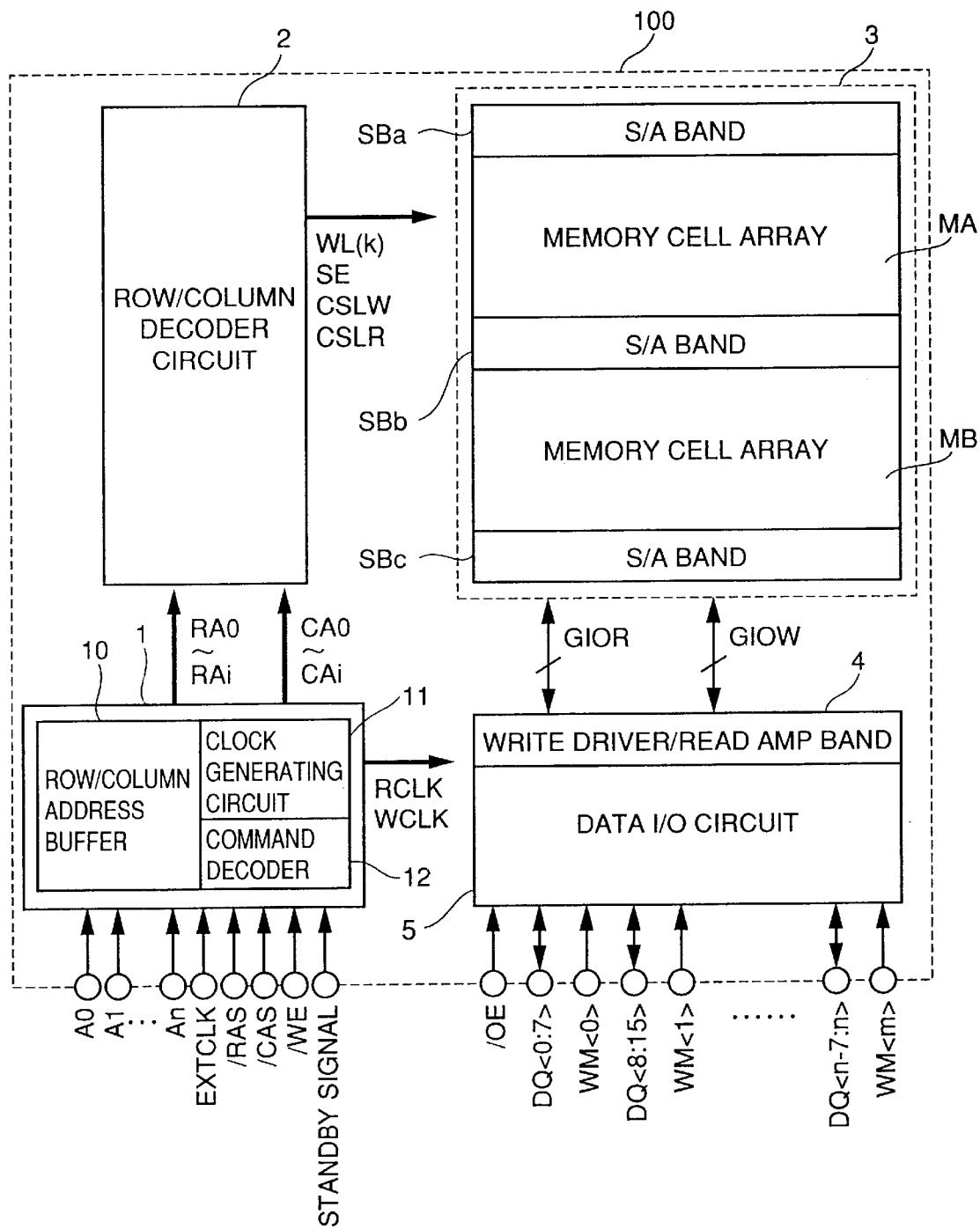
FIG. 1 is a block diagram showing the entire structure of a semiconductor memory device according to a first embodiment of the present invention.

Embodiments of the present invention are described in detail now in conjunction with the drawings. It is noted that like or corresponding components in the drawings are denoted by the same reference character and description thereof is not repeated here.

First Embodiment

According to the first embodiment of the present invention, a read amplifier circuit is described.

Referring to FIG. 1, a semiconductor memory device 100 according to the first embodiment of the invention is a synchronous semiconductor memory device having a control circuit 1 which includes a row/column address buffer 10 taking in address signals A0-An, a clock generating circuit 11 receiving external clock EXTCLK to generate a clock which determines timing of an internal operation, and a command decoder 12 generating an internal control signal according to an external control signal.

Row/column address buffer 10 predecodes a row-related address signal to output row address signals RA0-RAi and predecodes a column-related address signal to output column address signals CA0-CAi.

Clock generating circuit 11 generates internal clocks that are write clock signal WCLK for write operation and read clock signal RCLK for read operation, for example. Command decoder 12 receives row address strobe signal /RAS, column address strobe signal /CAS, write enable signal /WE, standby signal for setting an internal circuit in standby mode, and the like. Control circuit 1 is used to control a burst operation for successive input/output of data.

Semiconductor memory device 100 further includes a row/column decoder circuit 2 decoding row address signals RA0-RAi and column address signals CA0-CAi, and a memory unit 3 containing memory cell arrays MA and MB having a plurality of memory cells arranged in a matrix of rows and columns, word lines corresponding to respective rows, and bit lines corresponding to respective columns, and sense amplifier (S/A) bands SBa, SBb and SBc arranged in a manner of inserting the memory cell arrays therebetween.

Row/column decoder circuit 2 includes a row decoder decoding row address signals RA0-RAi and outputting word line activation signal WL (k) and sense amplifier activation signal SE, and a column decoder decoding column address signals CA0-CAi and outputting column selection signals CSLW and CSLR for selecting a column. The above-described row decoder and column decoder are contained in row/column decoder circuit 2.

Semiconductor memory device 100 further includes a write driver/read amplifier band 4 having a write driver for transmitting externally supplied data to a write line and a read amplifier for amplifying read data received from the memory cell array via a read line, and includes a data input/output circuit 5 controlling write driver/read amplifier band 4, and outputting read data to the outside or inputting externally provided write data into the write driver.

Data input/output circuit 5 transmits and receives a signal to and from an /OE terminal receiving output enable signal/OE, a data input/output terminal for input/output of input/output data DQ<0:7>, DQ<8:15>, . . . , DQ<n-7:n>, and a WM terminal receiving write mask signals WM (0), WM (1), . . . , WM (m). For a system LSI having a memory and a logic integrated therein, data input/output terminals are arranged on the order of several hundreds in order to enhance data transfer rate between the memory and the logic (not shown) mounted on the same substrate.

Memory unit 3 and write driver/read amplifier band 4 transmit/receive data to/from each other via a read line pair GIOR and a write line pair GIOW.

A read amplifier circuit is now described that is included in write driver/read amplifier band 4 to amplify read data from the memory cell array.

Figure 2:
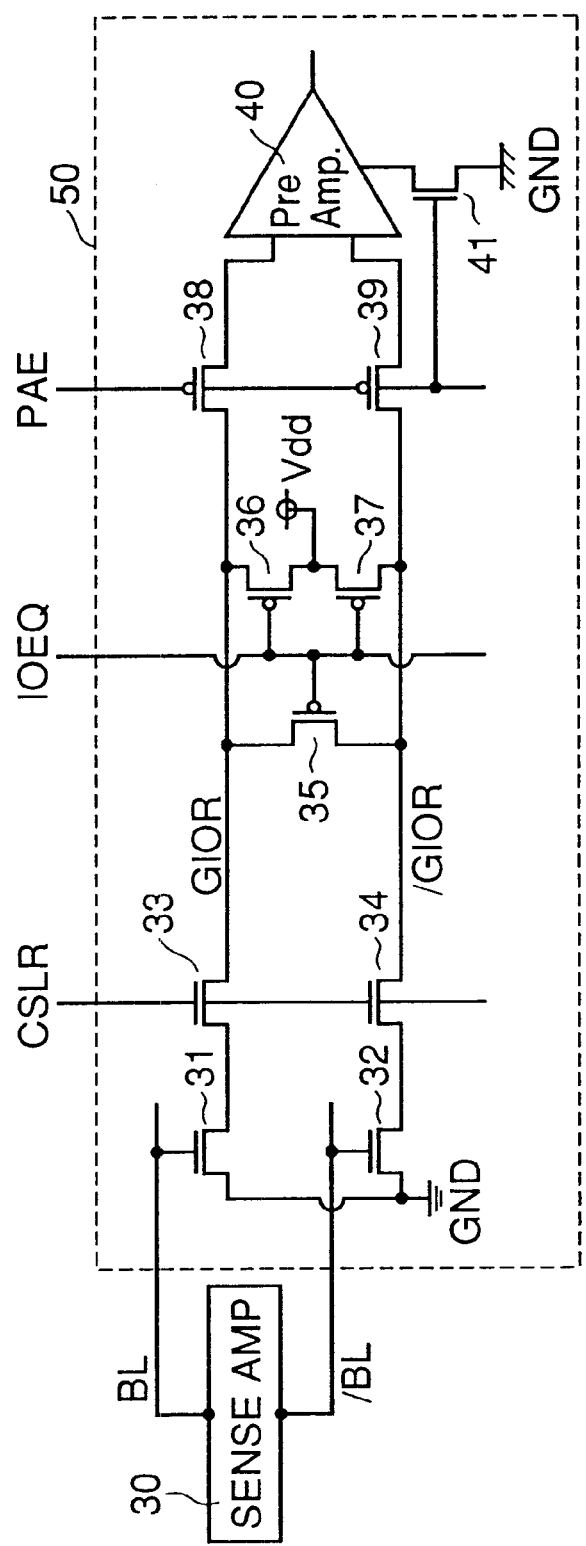
FIG. 2 is a circuit diagram showing a structure of a read amplifier circuit of read gate type.

Referring to FIG. 2, read amplifier circuit 50 includes a pair of read lines GIOR and /GIOR, read gates 31 and 32 each formed of an N channel MOS transistor, a switch transistor 41 formed of an N channel MOS transistor, column selection transistors 33 and 34 each formed of an N channel MOS transistor, P channel MOS transistors 35–39, and a preamplifier 40. Read gates 31 and 32 supply an output signal from a pair of bit lines BL and /BL to the pair of read lines GIOR and /GIOR. Column selection transistors 33 and 34 are driven by column selection signal CSLR when data is read to transmit the output signal to preamplifier 40 via the pair of read lines GIOR and /GIOR. P channel MOS transistors 35–37 constitute an equalize circuit to equalize the pair of read lines GIOR and /GIOR by equalize signal IOEQ. P channel MOS transistors 38 and 39 supply the output signal to preamplifier 40 when preamp enable signal PAE is inactive, i.e., preamp enable signal PAE is at L level. P channel MOS transistors 38 and 39 cut off the pair of read lines GIOR and /GIOR from preamplifier 40 when the paired read lines GIOR and /GIOR are equalized. Switch transistor 41 activates preamplifier 40 when preamp enable signal PAE is activated (preamp enable signal PAE is at H level). Preamplifier 40 amplifies the supplied output signal when preamp enable signal PAE is activated.

Figure 3:
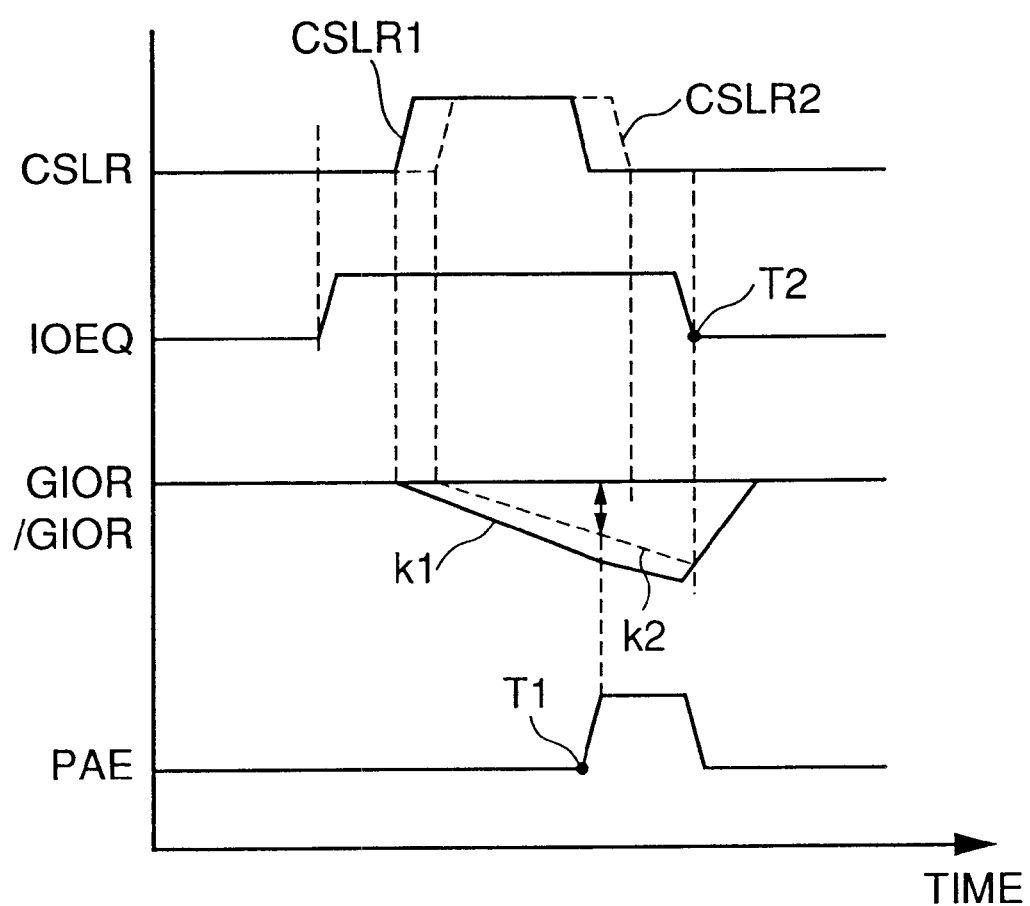
FIG. 3 is a timing chart showing an operation of the read amplifier circuit in FIG. 2.

Referring to FIGS. 2 and 3, an output signal read from each of memory cells (not shown) constituting memory cell arrays MA and MB is present on the pair of bit lines BL and /BL, amplified by a sense amplifier 30, and then output to the pair of read lines GIOR and /GIOR via read gates 31 and 32. When column selection signal CSLR is set at H level, column selection transistors 33 and 34 are driven and accordingly the output signal is transmitted on the pair of read lines GIOR and /GIOR toward preamplifier 40. In this case, equalize signal IOEQ is kept at H level during the period in which column selection signal stays at H level and the period added as a margin, in order to stop equalization of paired read lines GIOR and /GIOR. Then, a potential difference is generated between the paired read lines GIOR and /GIOR and the output signal is transmitted toward preamplifier 40.

At time T1 when the potential difference between the paired read lines GIOR and /GIOR is approximately 200 mV, preamp enable signal PAE changes from L level to H level. P channel MOS transistors 38 and 39 are thus turned off, and preamplifier 40 is cut off from the pair of read lines GIOR and /GIOR and activated by switch transistor 41 to amplify the supplied output signal.

After this, at time T2 when equalize signal IOEQ is set at L level, equalizing of the pair of read lines GIOR and /GIOR is started. In this case, since the paired read lines GIOR and /GIOR are connected to respective drains of read gates 31 and 32 and the paired bit lines BL and /BL are connected to respective gates of read gates 31 and 32 as apparent from FIG. 2, equalizing of the paired read lines GIOR and /GIOR hardly affects the pair of bit lines BL and /BL and data stored in a memory cell is maintained. The connection as shown in FIG. 2 between the pair of bit lines BL and /BL and the pair of read lines GIOR and /GIOR is called read gate type connection.

There are a plurality of pairs of read lines GIOR and /GIOR in memory unit 3 in FIG. 1. The timing at which H level of equalize signal IOEQ causes a potential difference between paired read lines GIOR and /GIOR required to amplify an output signal by preamplifier 40 varies depending on the actual location of the pair of read lines GIOR and /GIOR. A column selection transistor located relatively close to row/column decoder circuit 2 (see FIG. 1) which outputs column selection signal CSLR is turned on by column selection signal CSLR1 arriving earlier. Therefore, the potential difference is generated quickly as shown by the curve k1 in FIG. 3 between a pair of read lines GIOR and /GIOR arranged relatively close to row/column decoder circuit 2. On the other hand, a column selection transistor located relatively far from row/column decoder circuit 2 is turned on by column selection signal CSLR2 arriving later. Therefore, between a pair of read lines GIOR and /GIOR arranged relatively far from row/column decoder circuit 2, the potential difference is generated slowly as shown by the curve k2 in FIG. 3.

Considering this, the timing T1, at which preamp enable signal PAE is changed from L level to H level for amplifying by preamplifier 40 an output signal supplied thereto, is determined based on the pair of read lines GIOR and /GIOR on which the potential difference required to amplify the output signal by preamplifier 40 is generated last, among a plurality of pairs of read lines GIOR and /GIOR. Consequently, the early generated potential difference between the pair of read lines GIOR and /GIOR reaches a large value at time T2 when equalizing is started. It is then impossible to quickly equalize this pair of read lines GIOR and /GIOR after the start of equalization, and accordingly data stored in the memory array cannot be read at a high speed.

Figure 4:
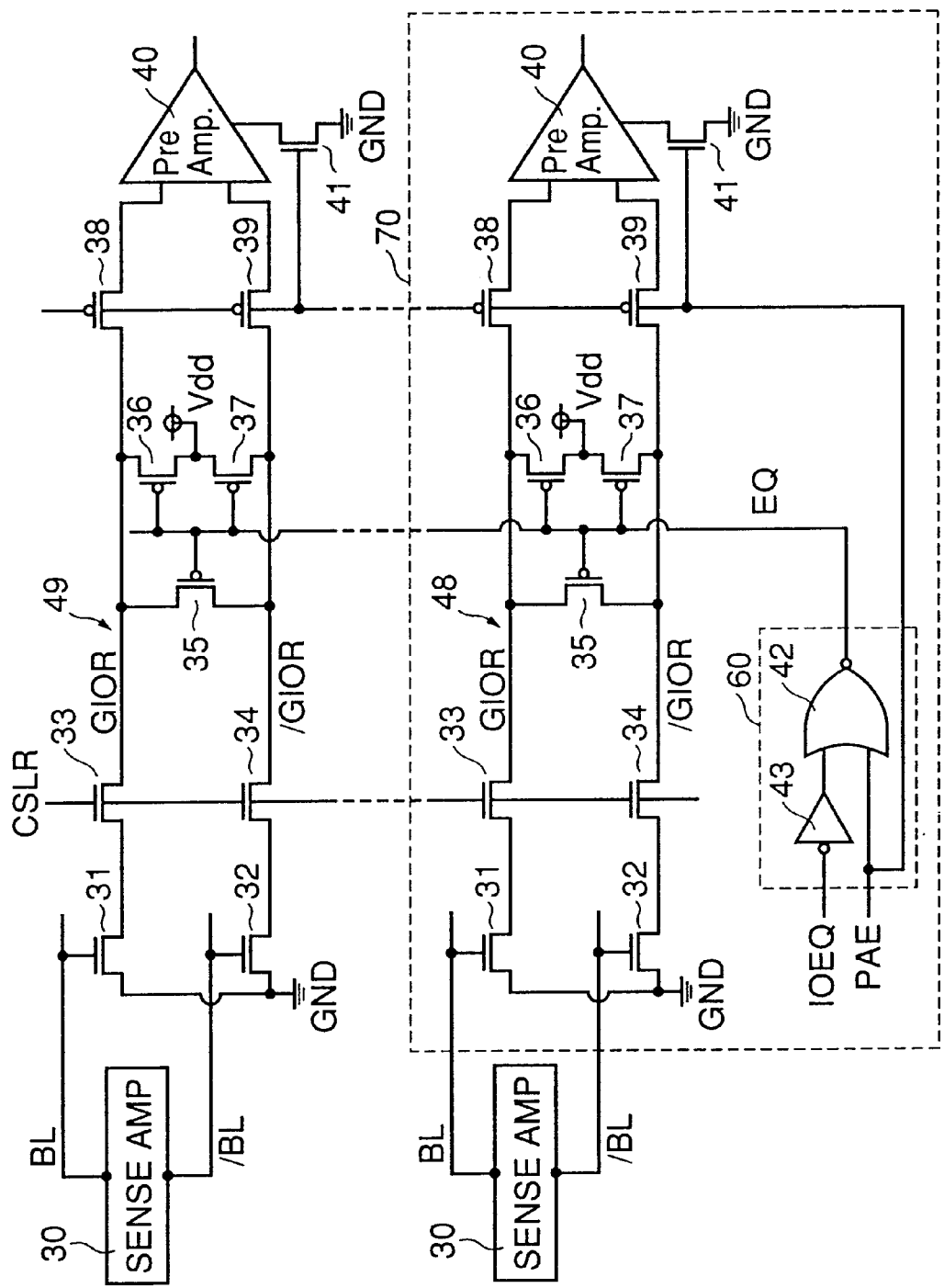
FIG. 4 is a circuit diagram showing a structure of a read amplifier circuit according to the first embodiment of the invention.

Referring to FIG. 4, a read amplifier circuit 70 according to the first embodiment includes a pair of read lines GIOR and /GIOR, read gates 31 and 32 each formed of an N channel MOS transistor, a switch transistor 41 formed of an N channel MOS transistor, column selection transistors 33 and 34 each formed of an N channel MOS transistor, P channel MOS transistors 35–39, a preamplifier 40, and an equalize start circuit 60. Read amplifier circuit 70 is produced by adding equalize start circuit 60 to read amplifier circuit 50 shown in FIG. 2. Description of read gates 31 and 32, switch transistor 41, column selection transistors 33 and 34, P channel MOS transistors 35–39 and preamplifier 40 is similar to that given in conjunction with FIG. 2.

Equalize start circuit 60 includes an NOR gate 42 and an inverter 43. Equalize start circuit 60 receives equalize signal IOEQ and preamp enable signal PAE and equalize start signal EQ is generated based on equalize signal IOEQ and preamp enable signal PAE.

Figure 5:
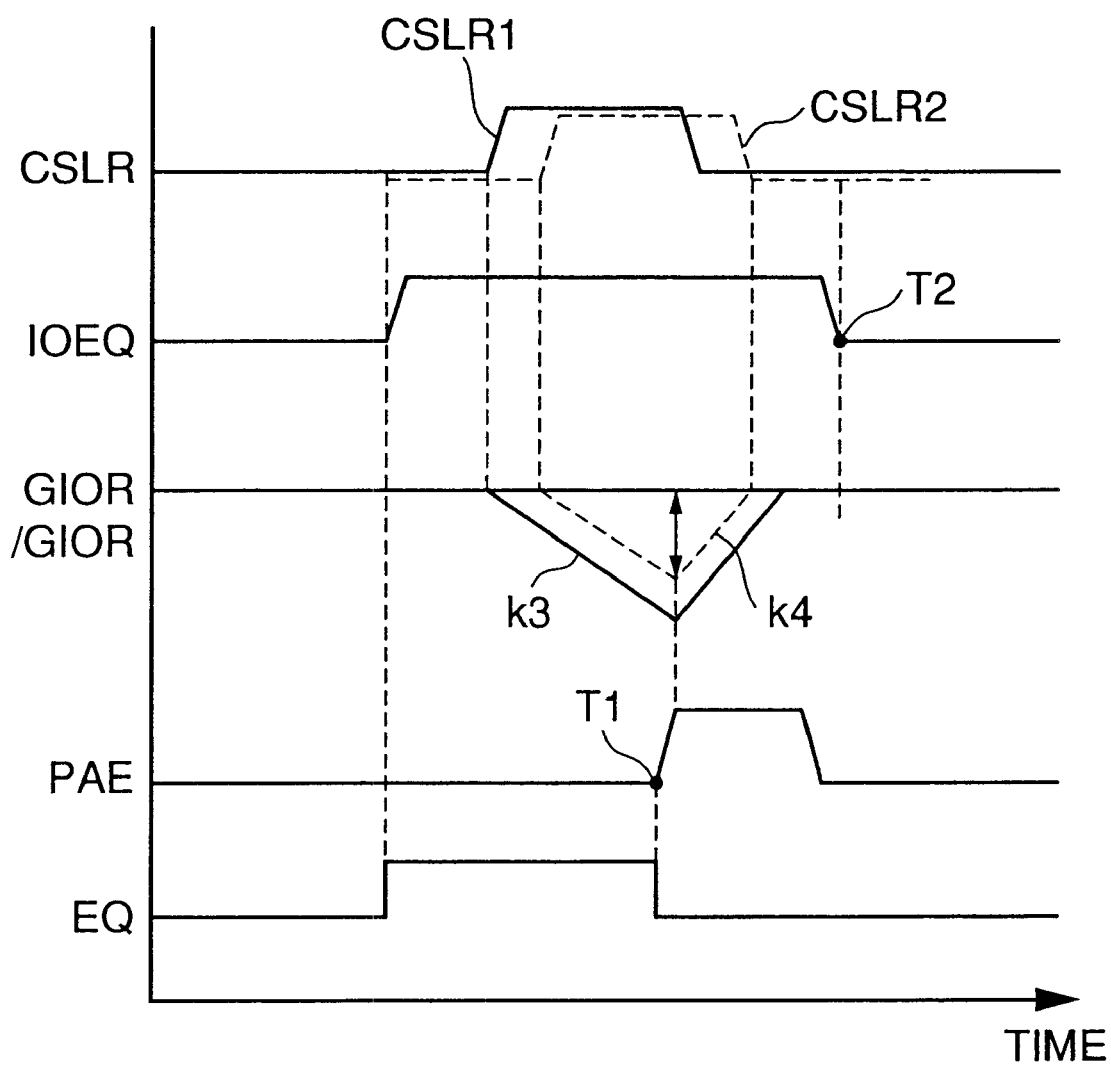
FIG. 5 is a timing chart showing an operation of the read amplifier circuit in FIG. 4.

Referring to FIG. 5, equalize start signal EQ changes from L to H level when equalize signal IOEQ changes from L to H level, and changes from H to L level at time T1 when preamp enable signal PAE changes from L to H level. In other words, equalize start signal EQ causes equalization of the pair of read lines GIOR and /GIOR at time T1 when preamp enable signal PAE is activated after an output signal is supplied from the pair of bit lines BL and /BL to the pair of read lines GIOR and /GIOR and then input to preamplifier 40.

Referring to FIGS. 4 and 5, equalize start circuit 60 supplies the generated equalize start signal EQ to an equalize circuit constructed of P channel MOS transistors 35–37, and supplies preamp enable signal PAE to a cut-off circuit constructed of P channel MOS transistors 38 and 39. In this way, at time T1 when preamp enable signal PAE is set at H level, preamplifier 40 is isolated from the pair of read lines GIOR and /GIOR to amplify the output signal, and the equalize circuit starts equalization of the pair of read lines GIOR and /GIOR.

As discussed above, the pairs of read lines GIOR and /GIOR include a pair of read lines 48 on which a potential difference is generated faster by column selection signal CSLR1 arriving early, and a pair of read lines 49 on which a potential difference is generated slower by column selection signal CSLR2 arriving later. The potential difference as shown by the curve k3 is generated on read line pair 48 when column selection signal CSLR1 changes to H level, and the potential difference as shown by the curve k4 is generated on read line pair 49 when column selection signal CSLR2 changes to H level. At time T1 when a voltage required for amplifying an output signal by a preamplifier 40 is generated on read line pair 49, preamp enable signal PAE is activated to equalize read line pair 48 on which the potential difference is generated faster and read line pair 49 on which the potential difference is generated slower.

In read amplifier circuit 50 having no equalize start circuit 60, equalization of the pair of read lines GIOR and /GIOR is started at time T2 when amplification of an output signal supplied to preamplifier 40 is completed (see FIGS. 2 and 3). In read amplifier circuit 70 having equalize start circuit 60, equalization of read line pairs 48 and 49 is started at time T1 when preamplifier 40 starts amplification of an output signal. Equalization of read line pairs 48 and 49 can thus be started earlier than that in read amplifier circuit 50 and therefore prior to the time when an early-generated potential difference on read line pair 48 becomes greater. Data can be read quickly from the memory cell array in this manner.

According to the first embodiment described above, equalization of the pair of read lines GIOR and /GIOR can be started simultaneously with input of an output signal from the pair of read lines GIOR and /GIOR to the preamplifier, and a high-speed cycle operation is thus possible by which data is read speedily.

Further, data can be read at a high speed with a small number of additional circuits.

Further, it is possible to associate preamp enable signal PAE for activating preamplifier 40 with equalize start signal EQ for starting equalization of the pair of read lines GIOR and /GIOR by adding equalize start circuit 60.

Second Embodiment

A read amplifier circuit according to the second embodiment is now described.

Figure 6:
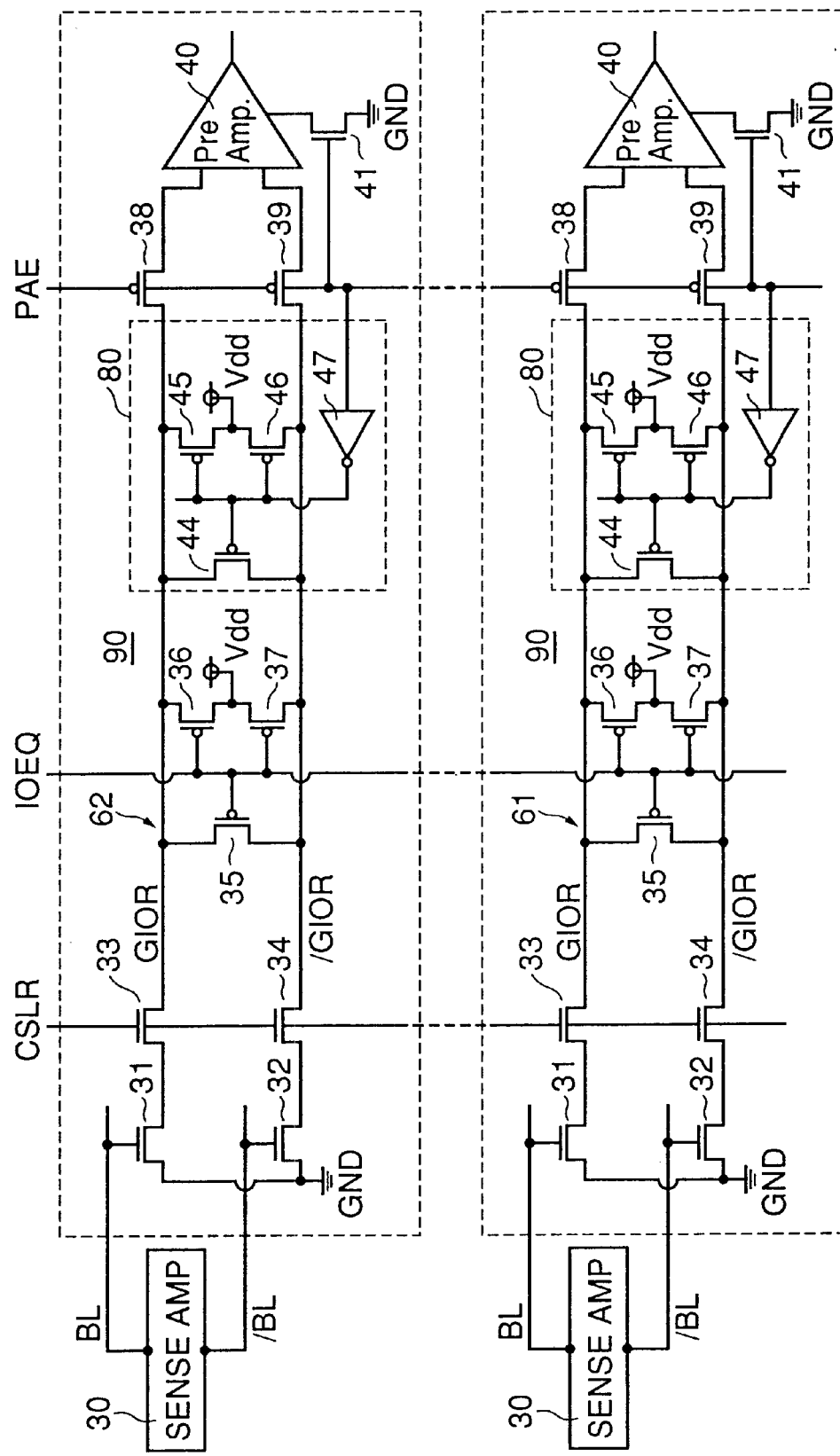
FIG. 6 is a circuit diagram showing a structure of a read amplifier circuit according to a second embodiment of the invention.

Referring to FIG. 6, read amplifier circuit 90 according to the second embodiment includes a pre-equalize circuit 80 instead of equalize start circuit 60 shown in FIG. 4.

Pre-equalize circuit 80 includes P channel MOS transistors 44–46 and an inverter 47. Preamp enable signal PAE supplied to pre-equalize circuit 80 is inverted by inverter 47 to cause P channel MOS transistors 44–46 to be driven. A pair of read lines GIOR and /GIOR is then equalized.

Figure 7:
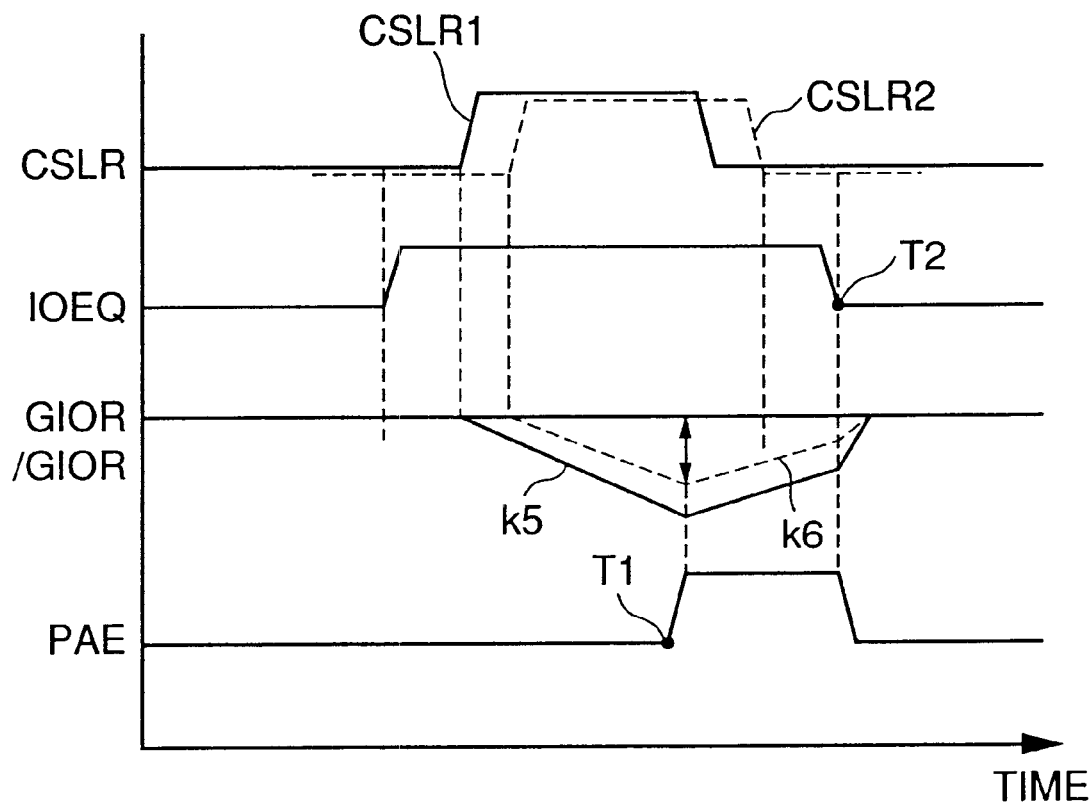
FIG. 7 is a timing chart showing an operation of the read amplifier circuit in FIG. 6.
Figure 8:
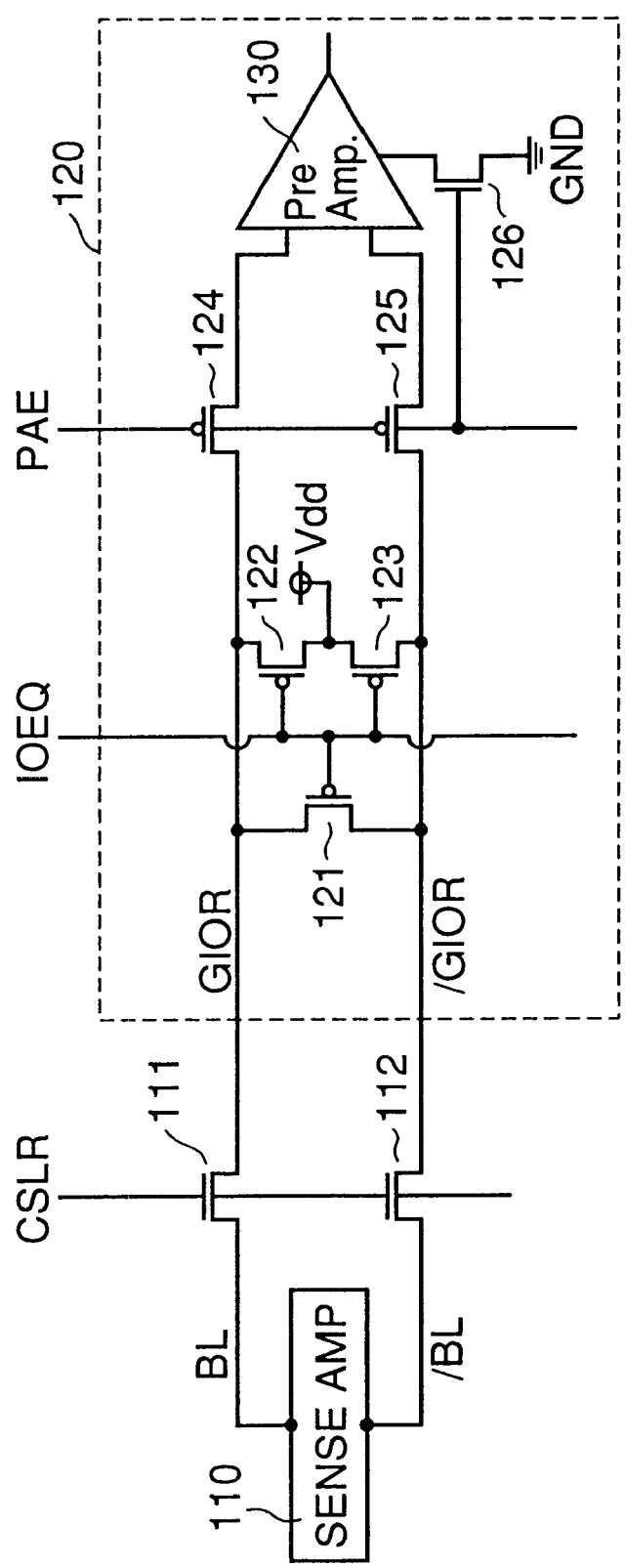
FIG. 8 is a circuit diagram showing a structure of a conventional read amplifier circuit.

P channel MOS transistors 44–46 have a smaller channel width than P channel MOS transistors 35–37. For this reason, the degree of pre-equalization by P channel MOS transistors 44–46 is smaller than that by P channel MOS transistors 35–37. Specifically, referring to FIG. 7, read gates 33 and 34 are opened by early-arriving column selection signal CSLR1 and a potential difference begins to appear on the pair of read lines GIOR and /GIOR according to an output signal. Then the output signal is supplied to a preamplifier 40 and preamp enable signal PAE changes from L level to H level, so that a cut-off circuit constructed of P channel MOS transistors 38 and 39 separates preamplifier 40 from the pair of read lines GIOR and /GIOR and pre-equalize circuit 80 equalizes the pair of read lines GIOR and /GIOR. As shown by the curve k5, the potential difference begins to decrease gradually when pre-equalize starts at time T1, and decreases sharply at time T2 when equalize signal IOEQ changes from H level to L level and equalization which is originally intended is started by an equalize circuit constructed of P channel MOS transistors 35–37. Equalization of the paired read lines GIOR and /GIOR is accordingly completed.

In other words, read amplifier circuit 90 according to the second embodiment has a characteristic that the pair of read lines GIOR and /GIOR is equalized as originally intended, after the read line pair is pre-equalized to a predetermined level by pre-equalize circuit 80.

Pairs of read lines GIOR and /GIOR include a read line pair 61 on which a potential difference is generated faster by column selection signal CSLR1 arriving earlier and a read line pair 62 on which a potential difference is generated slower by column selection signal CSLR2 arriving later as explained above. When column selection signal CSLR1 changes to H level, the potential difference as shown by the curve k5 appears on read line pair 61. When column selection signal CSLR2 changes to H level, the potential difference as shown by the curve k6 appears on read line pair 62. When a voltage required for amplifying the output signal by preamplifier 40 is generated on read line pair 62 at time T1, preamp enable signal PAE is activated and accordingly read line pair 61 on which the potential difference is generated faster and read line pair 62 on which the potential difference is generated slower are pre-equalized.

In read amplifier circuit 50 having no pre-equalize circuit 80, equalization of the pair of read lines GIOR and /GIOR is started at time T2 when amplification of an output signal supplied to preamplifier 40 is completed (see FIGS. 2 and 3). In read amplifier circuit 90 having pre-equalize circuit 80, pre-equalization of read line pairs 61 and 62 is started at time T1 when preamplifier 40 starts amplification of an output signal. Pre-equalization of read line pairs 61 and 62 can thus be started earlier than that in read amplifier circuit 50 and therefore prior to the time when an early-generated potential difference on read line pair 61 becomes greater. Consequently, data can be read quickly from the memory cell array.

In this way, read amplifier circuit 90 starts an originally intended equalization of the pair of read lines GIOR and /GIOR, after pre-equalization is started.

According to the second embodiment discussed above, pre-equalization of the pair of read lines GIOR and /GIOR can be started at the same time that the preamplifier starts amplification of an output signal input to the pair of read lines GIOR and /GIOR and data can thus be read quickly.

Further, data can be read at a high speed with a small number of additional circuits.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A read amplifier circuit comprising:

a pair of read lines receiving from a pair of bit lines an output signal amplified by a sense amplifier;

a preamplifier connected to said pair of read lines to amplify said output signal in response to a preamp enable signal;

a cut-off circuit cutting off said pair of read lines from said preamplifier when said preamp enable signal is activated; and an equalize circuit starting equalization of said pair of read lines when said preamp enable signal is activated.

2. The read amplifier circuit according to claim 1, further comprising an equalize start circuit generating an equalize start signal based on an equalize signal and said preamp enable signal for starting equalization of said pair of read lines when said preamp enable signal is activated, outputting the generated equalize start signal to said equalize circuit, and outputting said preamp enable signal to said cut-off circuit.

3. The read amplifier circuit according to claim 1, further comprising a pre-equalize circuit starting pre-equalization of said pair of read lines when said preamp enable signal is activated, wherein said equalize circuit equalizes said pair of read lines after said pre-equalize circuit starts pre-equalization of said pair of read lines.

4. A semiconductor memory device comprising:

a memory cell array storing data; and a read amplifier circuit receiving from said memory cell array an output signal according to said data to amplify and output the output signal to the outside, said read amplifier circuit including:

a pair of read lines receiving from a pair of bit lines an output signal amplified by a sense amplifier;

a preamplifier connected to said pair of read lines to amplify said output signal in response to a preamp enable signal;

a cut-off circuit cutting off said pair of read lines from said preamplifier when said preamp enable signal is activated; and an equalize circuit starting equalization of said pair of read lines when said preamp enable signal is activated.

* * * * *

UNITED STATES PATENT AND TRADEMARK OFFICE
CERTIFICATE OF CORRECTION

PATENT NO. : 6,445,633 B2
DATED : September 3, 2002
INVENTOR(S) : Mitsue Takahashi et al.

It is certified that error appears in the above-identified patent and that said Letters Patent is hereby corrected as shown below:

<u>Title page,</u>
Item [73], Assignee, change "Mitsubishi Kabushiki Kaisha" with
-- Mitsubishi Denki Kabushiki Kaisha --

Signed and Sealed this

Twenty-fifth Day of March, 2003

JAMES E. ROGAN
*Director of the United States Patent and Trademark Office*